(12) United States Patent
Sato et al.

(10) Patent No.: US 8,921,870 B2
(45) Date of Patent: Dec. 30, 2014

(54) LIGHT EMITTING DEVICE

(75) Inventors: Takahiro Sato, Kanagawa-ken (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 439 days.

(21) Appl. No.: 13/037,740

(22) Filed: Mar. 1, 2011

(65) Prior Publication Data

US 2012/0032196 A1 Feb. 9, 2012

(30) Foreign Application Priority Data

Aug. 9, 2010 (JP) .................................. 2010-178531

(51) Int. Cl.
- *H01L 29/18* (2006.01)
- *H01L 25/075* (2006.01)
- *H01L 33/60* (2010.01)

(52) U.S. Cl.
CPC ............. *H01L 25/0753* (2013.01); *H01L 33/60* (2013.01); *H01L 2224/48227* (2013.01); *H01L 2224/49107* (2013.01); *H01L 2224/73265* (2013.01)
USPC ........... 257/88; 257/98; 257/99; 257/E33.072

(58) Field of Classification Search
USPC .............................................. 257/88, E33.072
See application file for complete search history.

(56) References Cited

U.S. PATENT DOCUMENTS

2009/0045423 A1   2/2009   Hashimoto et al.

FOREIGN PATENT DOCUMENTS

| JP | 2006-237285 A | 9/2006 |
|---|---|---|
| JP | 2006-324134 | 11/2006 |
| JP | 2007-180234 | 7/2007 |
| JP | 2007-184319 | 7/2007 |
| JP | 2007-251142 | 9/2007 |
| JP | 2007-324204 | 12/2007 |
| JP | 2007-324275 | 12/2007 |
| JP | 2008-60167 | 3/2008 |
| JP | 2008-192710 | 8/2008 |
| JP | 2008-192940 A | 8/2008 |
| JP | 2009-130294 | 6/2009 |

OTHER PUBLICATIONS

Machine translation of Hayashi et al. (JP 2007-324275).*
Machine translation of Nagai et al. (JP 2007-180234).*
Japanese Office Action Issued Apr. 2, 2013 in Patent Application No. 2010-178531 (with English translation).
Office Action issued Jul. 26, 2012 in Japanese Application No. 2010-178531 (With English Translation).

* cited by examiner

*Primary Examiner* — Hsin-Yi Hsieh
(74) *Attorney, Agent, or Firm* — Oblon, Spivak, McClelland, Maier & Neustadt, L.L.P.

(57) ABSTRACT

According to one embodiment, a light emitting device includes a base substrate, first and second substrates, first and second semiconductor light emitting elements. The first and second substrates are provided on a major surface of the base substrate and include first and second reflection regions, respectively. The first and second semiconductor light emitting elements include first and second structural bodies including first and second light emitting layers, respectively. Each of the first and second semiconductor light emitting elements is inputted with a power not less than 1 Watt. An area of a face of the first semiconductor light emitting element is S1, and a gap between the first light emitting layer and the first substrate is t1. An area R1 of the first reflection region satisfies a relationship $(S1+100t1^2) \le R1 \le (S1+10000t1^2)$. A gap L between the first and the second semiconductor light emitting elements satisfies the relationships $100t1 \le L \le 10000t1$.

12 Claims, 7 Drawing Sheets

LIGHT EMITTING DEVICE

CROSS-REFERENCE TO RELATED APPLICATION

This application is based upon and claims the benefit of priority from Japanese Patent Application No. 2010-178531, filed on Aug. 9, 2010; the entire contents of which are incorporated herein by reference.

FIELD

Embodiments described herein relate generally to a light emitting device.

BACKGROUND

Light emitting devices such as LEDs (Light Emitting Diode) have high energy efficiencies and are therefore used in light emitting devices to save energy. In particular, white-light illumination with high efficiency and high luminous flux have been subjects of attention. In white-light illumination, for example, a blue LED is used to emit blue light which is then transformed to other wavelengths by phosphors to synthesize white light.

The blue light emitted from blue LEDs is easily absorbed by various members, including a substrate on which the LED is mounted. Configurations have therefore been considered in which materials such as silver that have a high reflectance at a wavelength of blue light are used to reflect the blue light to the exterior. Silver is a high-value material and deteriorates easily, and so there are particular limits on where silver can be used.

For example, a configuration is known in which the reflectance of a sub-mount where the light emitting device is to be mounted is set greater than that of an interconnection unit of the substrate. However, no specific configuration is known for a useful light emitting device equipped with a plurality of high-power semiconductor light emitting elements.

DETAILED DESCRIPTION

Figure 1A:
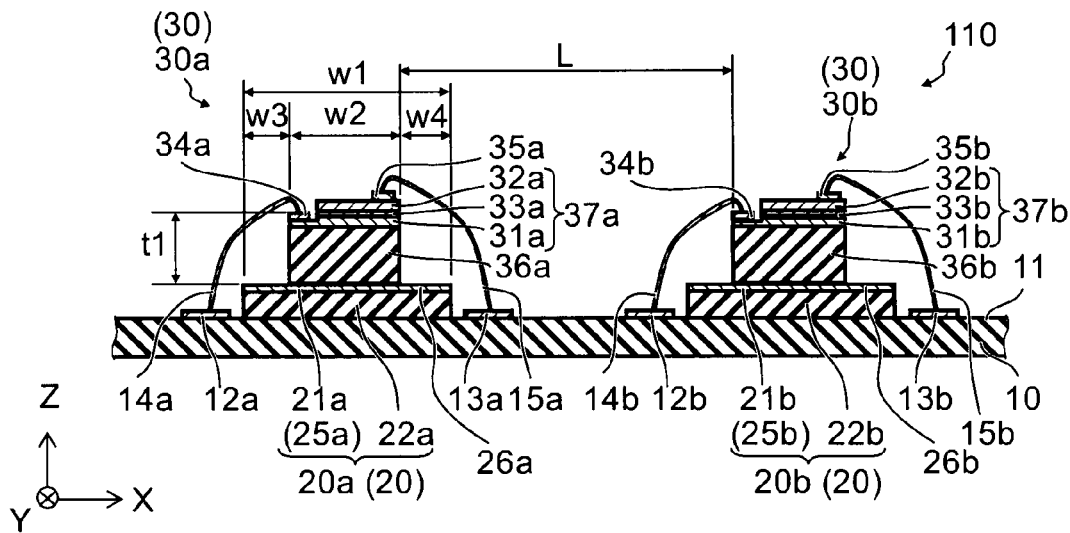
FIGS. 1A and 1B are schematic views illustrating a light emitting device according to a first embodiment.

According to one embodiment, a light emitting device includes a base substrate, a first substrate, a second substrate, a first semiconductor light emitting element, and a second semiconductor light emitting element.

The base substrate has a major surface. The first substrate is provided on the major surface and includes a first reflection region having a light reflectance higher than a light reflectance of the major surface. The second substrate is juxtaposed with the first substrate on the major surface and includes a second reflection region having a light reflectance higher than the light reflectance of the major surface. The first semiconductor light emitting element is provided on the first reflection region. The first semiconductor light emitting element includes a first structural body including a first light emitting layer. The second semiconductor light emitting element is provided on the second reflection region. The second semiconductor light emitting element includes a second stacked structural body including a second light emitting layer.

Each of the first and the second semiconductor light emitting elements is configured to be inputted with a power not less than 1 Watt. An area of a face on a side of the first semiconductor light emitting element opposite to the first substrate is S1 (square millimeters), and a gap between the first light emitting layer and the first substrate is t1 (millimeters). An area of a face on a side of the second semiconductor light emitting element opposite to the second substrate is S2, and a gap between the second light emitting layer and the second substrate is t2 (millimeters).

An area R1 of the first reflection region (square millimeters) satisfies a relationship $(S1+100t1^2) \leq R1 \leq (S1+10000t1^2)$. An area R2 of the second reflection region (square millimeters) satisfies a relationship $(S2+100t2^2) \leq R2 \leq (S2+10000t2^2)$. A gap L (millimeters) between the first semiconductor light emitting element and the second semiconductor light emitting element satisfies the relationships $100t1 \leq L \leq 10000t1$ and $100t2 \leq L \leq 10000t2$.

Embodiments are described hereinafter while referring to the drawings.

Drawings are schematic or simplified illustrations and relationships between thicknesses and widths of parts and proportions in size between parts may differ from actual parts. Also, even where identical parts are depicted, mutual dimensions and proportions may be illustrated differently depending on the drawing.

In the drawings and specification of this application, the same numerals are applied to elements that have already appeared in the drawings and been described, and repetitious detailed descriptions of such elements are omitted as appropriate.

First Embodiment

Figure 1B:
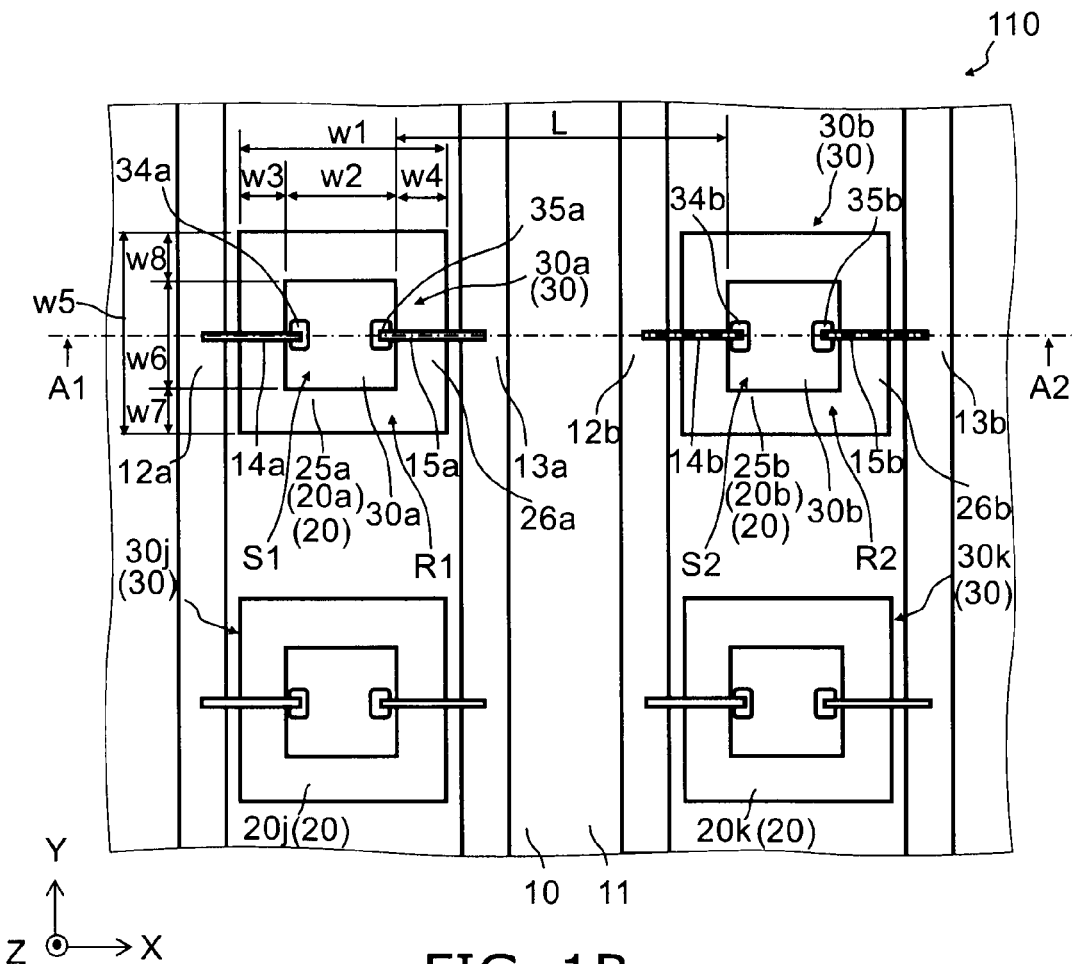

FIGS. 1A and 1B are schematic views illustrating a configuration of a light emitting device according to a first embodiment.

Specifically, FIG. 1B is a schematic plan view, and FIG. 1A is a cross-sectional view taken across line A1-A2 of FIG. 1B.

Figure 2:
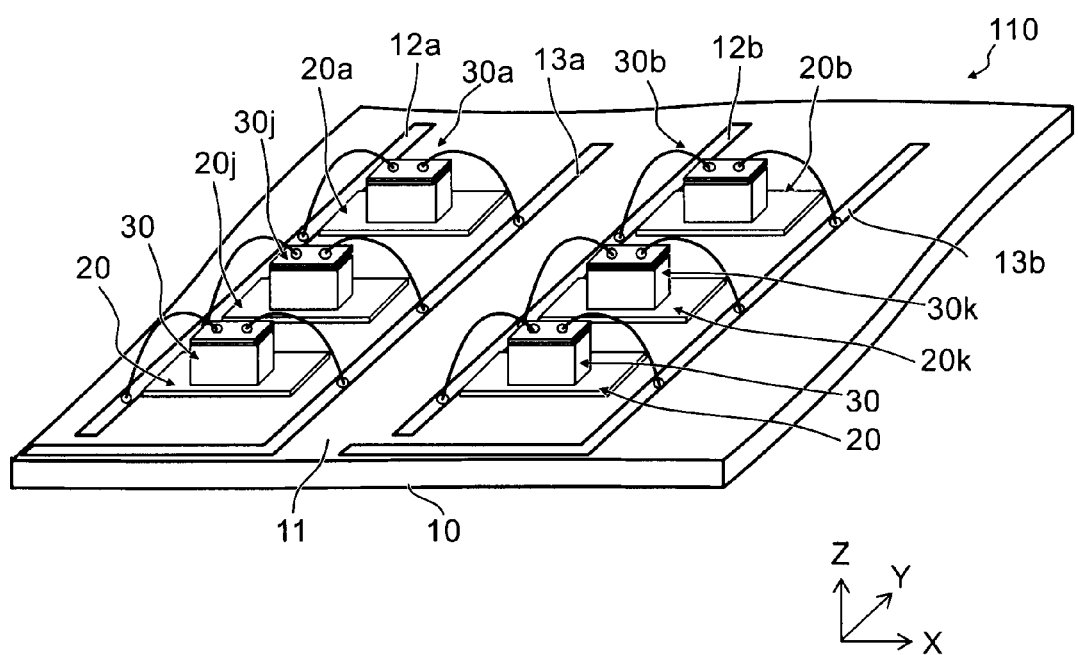
FIG. 2 is a schematic perspective view illustrating the light emitting device according to the first embodiment.

FIG. 2 is a schematic perspective view illustrating the configuration of the light emitting device according to the first embodiment.

As illustrated in FIGS. 1A, 1B and FIG. 2, a light emitting device 110 according the embodiment includes a base substrate 10, a first substrate 20a, a second substrate 20b, a first semiconductor light emitting element 30a, and a second semiconductor light emitting element 30b.

The base substrate 10 has a major surface 11.

The first substrate 20a is provided on the major surface 11 of the base substrate 10.

The second substrate 20b is juxtaposed with the first substrate 20a on the main surface 11 of the base substrate 10.

Here, a direction from the base substrate 10 toward the first substrate 20a is defined as a "Z-axis direction" (first direction). The Z-axis direction is also a direction from the base substrate 10 to the second substrate 20b.

A direction from the first substrate 20a to the second substrate 20b is defined as an "X-axis direction" (second direction). The X-axis direction is perpendicular to the Z-axis direction. A direction perpendicular to the Z-axis direction and perpendicular to the X-axis direction is defined as a "Y-axis direction" (third direction).

As illustrated in FIGS. 1A, 1B and FIG. 2, besides the first substrate 20a, the second substrate 20b, the first semiconductor light emitting element 30a and the second semiconductor light emitting element 30b, the light emitting device 110 further includes a third substrate 20j, a fourth substrate 20k, a third semiconductor light emitting element 30j and a fourth semiconductor light emitting element 30k.

In the example, the third substrate 20j is aligned with the first substrate 20a along the Y-axis direction and the fourth substrate 20k is aligned with the second substrate 20b along the Y-axis direction. However, that any alignment direction is acceptable. Additionally, the third semiconductor light emitting element 30j is aligned with the first semiconductor light emitting element 30a along the Y-axis direction, and the fourth semiconductor light emitting element 30k is aligned with the second semiconductor light emitting element 30b along the Y-axis direction. However, that any alignment direction is acceptable. Additionally, the light emitting device 110 may further include substrates and semiconductor light emitting elements other than those described above. Alignment directions of these other substrates and semiconductor light emitting elements may also be freely set.

The first substrate 20a and the second substrate 20b are two substrates among a plurality of substrates 20. For example, the first substrate 20a and the second substrate 20b can be defined as being the two closest substrates 20 of the plurality of substrates 20. The first semiconductor light emitting element 30a and the second semiconductor light emitting element 30b are two of a plurality of semiconductor light emitting elements 30. For example, the first semiconductor light emitting element 30a and the second semiconductor light emitting element 30b can be defined as being the two closest semiconductor light emitting elements 30 of the plurality of semiconductor light emitting elements 30.

The following is a description relating to the first substrate 20a, the second substrate 20b, the first semiconductor light emitting element 30a and the second semiconductor light emitting element 30b.

The first substrate 20a includes a first reflection region 25a which has a light reflectance higher than that of the major surface 11 of the base substrate 10. Here, the light reflectance is a reflectance with respect to light (luminescent light) emitted by the first semiconductor light emitting element 30a.

The second substrate 20b includes a second reflection region 25b which has a light reflectance higher than that of the major surface 11 of the base substrate 10. Here, the light reflectance is a light reflectance with respect to light (luminescent light) emitted by the second semiconductor light emitting element 30b.

The first semiconductor light emitting element 30a is provided on the first reflection region 25a of the first substrate 20a on a side opposite to the base substrate 10. The first semiconductor light emitting element 30a includes a first stacked structural body 37a that includes a first light emitting layer 33a. The first substrate 20a is disposed between the base substrate 10 and the first semiconductor light emitting element 30a.

The second semiconductor light emitting element 30b is provided on the second reflection region 25b of the second substrate 20b on a side opposite to the base substrate 10. The second semiconductor light emitting element 30b includes a second stacked structural body 37b that includes a second light emitting layer 33b. The second substrate 20b is disposed between the base substrate 10 and the second semiconductor light emitting element 30b.

In the example, the first substrate 20a includes a first base body 22a and a first highly-reflective layer 21a provided on a first semiconductor light emitting element 30a side of the first base body 22a. The first highly-reflective layer 21a has a light reflectance higher than that of the major surface 11 of the base substrate 10. The first highly-reflective layer 21a forms the first reflection region 25a.

In the example, the second substrate 20b includes a second base body 22b and a second highly-reflective layer 21b provided on a second semiconductor light emitting element 30b side of the second base body 22b. The second highly-reflective layer 21b has a light reflectance higher than that of the major surface 11 of the base substrate 10. The second highly-reflective layer 21b forms the second reflection region 25b.

For the first highly-reflective layer 21a and the second highly-reflective layer 21b, for example, at least one of silver and aluminum can be used.

For the first base body 22a and the second base body 22b, any desired material can be used.

Positions of end surfaces of the first highly-reflective layer 21a and positions of end surfaces of the first base body 22a can be identical in an X-Y plane.

Positions of end surfaces of the second highly-reflective layer 21b and positions of end surfaces of the second base body 22b can be identical in the X-Y plane.

However, the embodiment is not limited to this arrangement, and the end surfaces of the first highly-reflective layer 21a may be set back from the end surfaces of the first base body 22a. The end surfaces of the second reflectance region 21b may be set back from the end surfaces of the second base body 22b.

Hereinafter, a case is described in which the positions of end surfaces of the first highly-reflective layer 21a and the positions of end surfaces of the first base body 22a are identical in the X-Y plane, and the positions of end surfaces of the second highly-reflective layer 21b and the positions of end surfaces of the second base body 22b identical in the X-Y plane. In the example, all surfaces on the first semiconductor light emitting element 30a side of the first substrate 20a form the first reflection region 25a, and all surfaces on the second semiconductor light emitting element 30b side of the second base body 20b form the second reflection region 25b.

The first semiconductor light emitting element 30a is, for example, an LED. The first stacked structural body 37a further includes a first p-type semiconductor layer 32a and a first n-type semiconductor layer 31a. The first p-type semiconductor layer 32a is provided on the first light emitting layer 33a on a side opposite to the first substrate 20a. The first n-type semiconductor layer 31a is provided between the first light emitting layer 33a and the first substrate 20a. The first semiconductor light emitting element 30a further includes a first element substrate 36a. The first element substrate 36a is provided between the first n-type semiconductor layer 31a and the first substrate 20a, and is transparent with respect to a light emitted from the first light emitting layer 33a.

The second semiconductor light emitting element 30b is, for example, also an LED. The second stacked structural body 37b further includes a second p-type semiconductor layer 32b and a second n-type semiconductor layer 31b. The second p-type semiconductor layer 32b is provided on the second light emitting layer 33b on a side opposite to the second substrate 20b. The second n-type semiconductor layer 31b is provided between the second light emitting layer 33b and the second substrate 20b. The second semiconductor light emitting element 30b is further provided with a second element substrate 36b. The second element substrate 36b is transparent with respect to a light emitted from the second light emitting layer 33b.

The first semiconductor light emitting element 30a and the second semiconductor light emitting element 30b are light emitting elements that, for instance, make use of nitride semiconductors. The first element substrate 36a is, for example, a substrate used when growing crystals of the first light emitting layer 33a and the first p-type semiconductor layer 32a. The second element substrate 36b is, for example, a substrate used when growing crystals of the second n-type semiconductor layer 31b, the second light emitting layer 33b and the second p-type semiconductor layer 32b.

In the first stacked structural body 37a, a portion of the first n-type semiconductor layer 31a, a portion of the first p-type semiconductor layer 32a, and a portion of the first light emitting layer 33a are removed from a surface on a side of the first p-type semiconductor layer 32a. In the first stacked structural body 37a, a portion of the first n-type semiconductor layer 31a on a surface on a side of the first p-type semiconductor layer 32a is exposed.

The first semiconductor light emitting element 30a further includes a first p-side element electrode 35a and a first n-side element electrode 34a. The first p-side element electrode 35a contacts the first p-type semiconductor layer 32a at a surface of a first p-type semiconductor layer 32a side of the first stacked structural body 37a. The first n-side element electrode 34a contacts the first n-type semiconductor layer 31a at a surface of a first p-type semiconductor layer 32a side of the first stacked structural body 37a.

In the second stacked structural body 37b, a portion of the second n-type semiconductor layer 31b, and portions of the second p-type semiconductor layer 32b and the second light emitting layer 33b are removed from a surface on a second p-type semiconductor layer 32b side. In the second stacked structural body 37b, a portion of the second n-type semiconductor layer 31b is exposed at a surface of the second p-type semiconductor layer 32b side.

The second semiconductor light emitting element 30b further includes a second p-side element electrode 35b and a second n-side element electrode 34b. The second p-side element electrode 35b contacts the second p-type semiconductor layer 32b on a surface on the second p-type semiconductor layer 32b side of the second stacked structural body 37b. The second n-side element electrode 34b contacts the second n-type semiconductor layer 31b on a face of the second p-type semiconductor layer 32b side of the second stacked structural body 37b.

The light emitting device 110 further includes a first p-side base electrode 13a and a first n-side base electrode 12a provided on the major surface 11 of the base substrate 10. The first p-side base electrode 13a is electrically connected to the first p-side element electrode 35a, and the first n-side base electrode 12a is electrically connected to the first n-side element electrode 34a. Specifically, the light emitting device 110 further includes a first p-side wire 15a that connects the first p-side base electrode 13a and the first p-side element electrode 35a, and a first n-side wire 14a that connects the first n-side base electrode 12a and the first n-side element electrode 34a.

The light emitting device 110 further includes a second p-side base electrode 13b and a second n-side base electrode 12b provided on the major surface 11 of the base substrate 10. The second p-side base electrode 13b is electrically connected to the second p-side element electrode 35b and the second n-side base electrode 12b is electrically connected to the second n-side element electrode 34b. Specifically, the light emitting device 110 further includes a second p-side wire 15b that connects the second p-side base electrode 13b and the second p-side element electrode 35b, and a second n-side wire 14b that connects the second n-side base electrode 12b and the second n-side element electrode 34b.

Current is supplied to the first light emitting layer 33a via the first p-side base electrode 13a, the first p-side wire 15a, the first p-side element electrode 35a and the first p-type semiconductor layer 32a as well as the first n-side base electrode 12a, the first n-side wire 14a, the first n-side element electrode 34a, and the first n-type semiconductor layer 31a, and luminescent light is emitted from the first light emitting layer 33a.

Similarly, luminescent light is emitted from the second light emitting layer 33b.

A portion of the luminescent light emitted from the first light emitting layer 33a advances in an upward direction (direction of the first p-type semiconductor layer 32a) and is extracted to an exterior. Another portion of the luminescent light emitted from the first light emitting layer 33a advances in a downward direction (direction of the first n-type semiconductor layer 31a), and is reflected by the first reflection region 25a. The direction of advancement is thus changed to the upward direction and the portion is extracted to the exterior.

A portion of the luminescent light emitted from the first light emitting layer 33a advances in oblique directions with respect to the X-Y plane. A portion of the light advancing in the oblique directions is reflected by the first reflection region 25a, advances upward, and is extracted to the exterior. Another portion of the light advancing in the oblique directions does not enter the first reflection region 25a and enters the base substrate 10. Here, the light reflectance of the major surface 11 of the base substrate 10 is smaller than that of the first reflective region 25a. Hence, the light that entered the base substrate 10 is absorbed to a higher degree than the light that entered the first reflection region 25a.

Similarly, portions of the luminescent light emitted from the second light emitting layer 33b advance upward, or downward to be reflected by the second reflection region 25b and extracted to the exterior. In addition, a portion of the luminescent light emitted from the second light emitting layer 33b does not enter the second reflection region 25b, and enters and absorbed by the base substrate 10.

Increasing the reflectance of the major surface 11 of the base substrate 10 improves light extraction efficiency. However, since the base substrate 10 has provided thereon electrical members for various electrodes, wires, electrical elements and the like, there is a limit to an improvement of reflectance. For example, covering the major surface 11 of the base substrate 10 with a silver layer of high reflectance or the like is difficult to employ for reasons of high cost and considerations about the reliability of silver From a perspective of improving a luminescent light extraction efficiency, the larger the first reflection region 25a and the second reflection region 25b, the greater the advantage. However, due to constraints on an external form of the light emitting device 110 and constraints on an area required for the electrical members provided on the base substrate 10, areas of the first reflection region 25a and the second reflection region 25b are set to be not larger than a predetermined size.

Further, to ensure an efficient release of heat generated when operating the semiconductor light emitting elements 30, a constant gap of at least a predetermined amount is set between the plurality of light emitting elements 30.

As described above, in the light emitting device 110, various practical constraints exist, including constraints due to the external form of the light emitting device 110, constraints due to the electrical members provided in the base substrate 10, constraints due to the area of the reflection regions, constrains due to the gap between the semiconductor light emitting elements 30, and constraints due to reliability of the light emitting device 110, as well as constraints due to cost.

According to the embodiment, a useful light emitting device including a plurality of high power semiconductor light emitting elements and having a high light extraction efficiency is provided while taking various constraints such as those described above into consideration.

Specifically, in the light emitting device 110 according to the embodiment, it is possible to input electrical power of 1 Watt or more to each of the first semiconductor light emitting element 30a and the second semiconductor light emitting element 30b.

An area of a face on the first semiconductor light emitting element 30a on a side opposes to the first base substrate 20a is defined as an area S1 (square millimeters: mm$^2$). A gap between the first light emitting layer 33a and the first substrate 20a (which is a height measured from the first substrate 20a to the first light emitting layer 33a) is defined as height t1 (millimeters: mm).

An area R1 (mm$^2$) of the first reflection region 25a then satisfies the relationship expressed by Equation 1.

$$(S1+100t1^2) \leq R1 \leq (S1+10000t1^2) \quad \text{(Equation 1)}$$

An area of the face on the side of the second semiconductor light emitting element 30b that opposes the second substrate 20b is defined as area S2 (mm$^2$). A gap between the second light emitting layer 33b and the second substrate 20b (which is a height measured from the second substrate 20b to the second light emitting layer 33b) is defined as height t2 (mm).

An area R2 (mm$^2$) of the second reflection region 25b then satisfies the relationship expressed by Equation 2

$$(S2+100t2^2) \leq R2 \leq (S2+10000t2^2) \quad \text{(Equation 2)}$$

A gap L (mm) between the first semiconductor light emitting element 30a and the second semiconductor light emitting element 30b satisfies the relationships expressed in Equation 3 and Equation 4.

$$100t1 \leq L \leq 10000t1 \quad \text{(Equation 3)}$$

$$100t2 \leq L \leq 10000t2 \quad \text{(Equation 4)}$$

In other words, when respective areas of faces of the plurality of the semiconductor light emitting elements 30 on sides opposing the plurality of substrates 20 is defined as an area S, and each gap between the light emitting layer of the semiconductor light emitting element 30 and the substrate 20 is defined respectively as t, an area R of a reflection region of the substrate satisfies the relationship $(S+100t^2) \leq R \leq (S+10000t^2)$ and the gap L between the semiconductor light emitting elements 30 satisfies $100t \leq L \leq 10000t$.

Thereby, a practical light emitting device including a plurality of high-power semiconductor light emitting elements and having high light extraction efficiency is provided.

Specifically, setting the gap L between the first semiconductor light emitting element 30a and the second semiconductor light emitting element 30b to be at least 100t1 and at least 100t2 enables heat dissipation to be maintained when electrical power of 1 Watt or more is inputted to each of the first semiconductor light emitting element 30a and the second semiconductor light emitting element 30b, and obtain light emission of high efficiency for the first semiconductor light emitting element 30a and the second semiconductor light emitting element 30b.

On the other hand, if the gap L is greater than 10000t1 or greater than 10000t2, the size will exceed a target size for the light emitting device 110. Alternatively, in the case that the size of the light emitting device 110 is fixed, the number of semiconductor light emitting elements 30 provided in the light emitting device 110 will be smaller, and a targeted luminance for the light emitting device 110 will not be obtained.

Accordingly, by having gap L between the first semiconductor light emitting element 30a and the second semiconductor light emitting element 30b satisfy the relationships of the above described Equation 3 and Equation 4, heat dissipation to support an electrical power of at least 1 Watt, a size specification of the light emitting device 110, and a number of semiconductor light emitting elements with the targeted brightness can be satisfied.

Moreover, by having the area R1 of the first reflection region 25a satisfy the relationship of the above-described Equation 1 and the area R2 satisfy the relationship of the above-described area Equation 2, a high light extraction efficiency is obtained without the first reflection region 25a and second reflection region being larger than necessary.

Specifically, by setting the area R1 of the first reflection region 25a to at least $(S1+100t1^2)$, the luminescent light emitted from the first semiconductor light emitting element 30a can be extracted with high efficiency. In addition, by setting the area R1 to be no more than $(S1+10000t1^2)$, the first reflection region 25a does not become larger than necessary. Specifically, the area for the electric members provided on the major surface 11 of the base substrate 10 can be secured. In addition, an area of the first highly-reflective layer 21a resulting from silver or the like used as the first reflection region can be a minimum at which the high light extraction efficiency is obtained, which is advantageous with regard to cost. Specifically, it is possible to maximize the light extraction efficiency while satisfying the various practical constraints.

Similarly, by setting the area R2 of the second reflection region 25b to at least $(S2+100t^2)$, the luminescent light from the second semiconductor element 30b can be extracted with high efficiency. Additionally, by setting the area R2 to no more than $(S2+10000t2)^2$, the second region does not become larger than necessary. Accordingly, it is possible to maximize the light extraction efficiency while satisfying the various practical constraints.

Equation 3 and Equation 4 were derived according to the considerations described below.

The inventors set the size of the reflection region of the substrate 20 and the size of the semiconductor light emitting element 30 as parameters, and simulated states of the luminescent light emitted in a transverse direction (oblique with respect to the Z-axis direction) from the semiconductor light emitting elements 30 entering the reflection region. Hereinafter, examples for the first reflection region 25a of the first substrate 20a and the first semiconductor light emitting element 30a are described in relation to the simulation.

In the simulation, for simplicity, the form of the first reflection region 25a (external form when viewed along the Z-axis direction) was assumed to be square. In addition, the external form of the first semiconductor light emitting element 30a (external form when viewed in the Z-axis direction) was also assumed to be square.

A width along the X-axis direction of the first reflection region 25a is defined as a reflection region width w1. A width w5 along the Y-axis direction of the first reflection region 25a is the same as the reflection region width w1.

A width along the X-axis direction of the first semiconductor light emitting element 30a is defined as a semiconductor light emitting element width w2. A width w6 along the Y-axis direction of the first semiconductor light emitting element 30a is the same as the semiconductor light emitting element width w2.

The first semiconductor light emitting element 30a is disposed centrally in the first reflection region 25a. In other words, a width w3 and a width w4 of a portion protruding along the X-axis direction from the first semiconductor light emitting element 30a of the first reflection region 25a are the same. Specifically, w3=w4=(w1−w2)/2. Additionally, a width w7 and a width w8 of a portion protruding along the Y-axis direction from the first semiconductor element 30a of the first reflection region 25a are the same. Specifically, w7=w8=(w5−w6)/2.

Luminescent light is then evenly emitted from the side faces of the first light emitting layer 33a.

Substituting for the reflection region width w1 of the first reflection region 25a, the semiconductor light emitting element width w2 of the first semiconductor light emitting element 30a, and the height t1 of the first light emitting layer 33a of the first semiconductor light emitting element 30a, a reflection region incidence rate Rr (%), which is the proportion of all the luminescent light emitted from the first light emitting layer 33b that enters the first reflection region 25a, was calculated. When the reflection region incidence rate Rr is high, the light extraction efficiency is high.

Figure 3A:
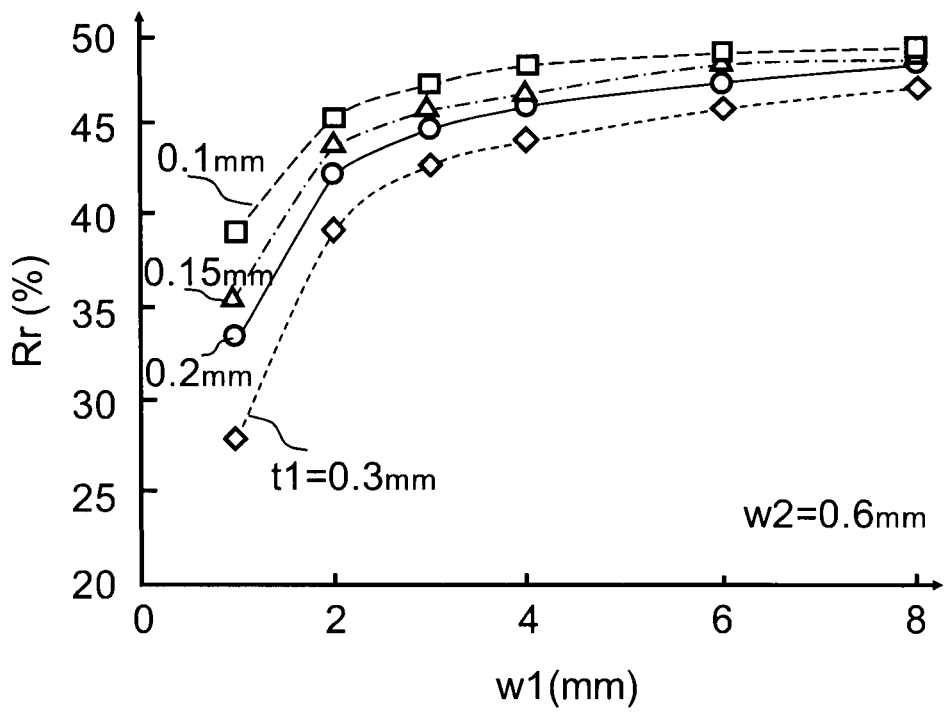
FIGS. 3A and 3B are graphs illustrating simulation results of the characteristics of a light emitting device.
Figure 3B:
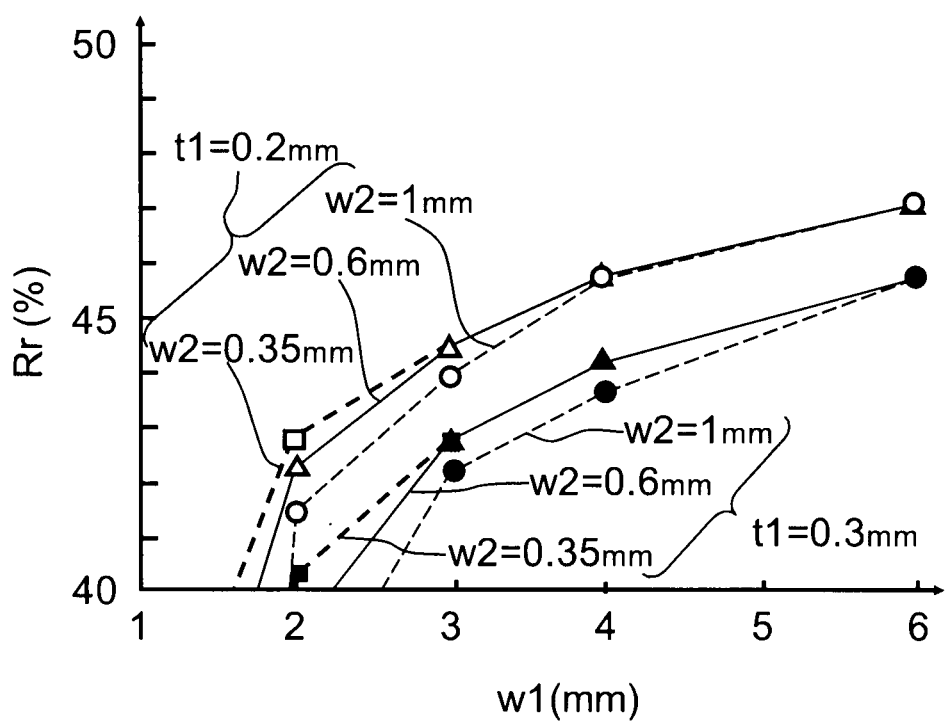

FIGS. 3A and 3B are graphs illustrating simulation results of the characteristics of the light emitting device.

Specifically, FIG. 3A shows the simulation results for the reflection region incidence rate Rr when the semiconductor light emitting element width w2 of first semiconductor light emitting element 30a is 0.6 mm, and the height t1 is 0.1 mm, 0.15 mm, 0.2 mm and 0.3 mm. FIG. 3B shows the simulation results for the reflection region incidence rate Rr when the semiconductor light emitting element width w2 is 0.35 mm, 0.6 mm and 1 mm, and the height t1 is 0.2 mm and 0.3 mm.

In these FIGS., the horizontal axis is the reflection region width w1 and the vertical axis is the reflection region incidence rate Rr.

As illustrated in FIG. 3A, when the semiconductor light emitting element width w2 is constant, the reflection region incidence rate Rr increases as the reflection region width w1 increases. Also, the reflection region incidence rate Rr is smaller as the height t1 increases. When the reflection region width w1 is increases to 6 mm or more, the reflection region incidence rate Rr exceeds 45%.

When the reflection region width w1 is less than 2 mm, the reflection region incidence rate Rr becomes strongly dependent on the reflection region width w1. When the reflection region width w1 is 2 mm or more, dependence of the reflection region incidence rate Rr on the reflection region width w1 is reduced. When the reflection region width w1 is 2 mm or more, dependence on the height t1 becomes stronger than the dependence on the reflection region width w1.

When the reflection region incidence rate Rr is less than 43%, the reflection region incidence rate drops steeply as the reflection region width w1 is reduced. For this reason, settings are made to ensure that the reflection region incidence rate Rr does not drop below 43%. In other words, a permitted range for the reflection region incidence rate Rr is 43% or more. Additionally, within the permitted range, it is even more preferable that the reflection region incidence rate Rr is set to 45% or more. When the reflection region incidence rate Rr is 45% or more, a high light extraction efficiency is stably obtained. Thus, there are two standards established relating to the reflection region incidence rate Rr (43% or more and 45% or more).

As shown in FIG. 3A, the reflection region width w1 at which the reflection region incidence rate Rr is 45% or more is dependent on the height t1. For example, the reflection region width w1 at which the reflection region incidence rate Rr is 45% or more, is approximately 2 mm when the height t1 is 0.1 mm, approximately 2.7 mm when the height t1 is 0.15 mm, approximately 3.5 mm when the height t1 is 0.2 mm, and approximately 5.4 mm when the height t1 is 0.3 mm. Thus, the reflection region width that sets the reflection region incidence rate Rr to a fixed value or more is dependent on a value of the height t1.

The reflection region width w1 at which the reflection region incidence rate Rr becomes at least 43% is approximately 1.5 mm when the height t1 is 0.1 mm, approximately 1.9 mm when the height t1 is 0.15 mm, approximately 2.2 mm when the height is 0.2 mm, and approximately 3.1 mm when the height t1 is 0.3 mm.

As illustrated in FIG. 3B, when substituting 0.35 mm, 0.6 mm, and 1 mm for the semiconductor light emitting element width w2 and 0.2 mm and 0.3 mm for the height t1, the reflection region width that sets the reflection region incidence rate Rr to a fixed value or more is dependent on the value of the height t1.

Figure 4A:
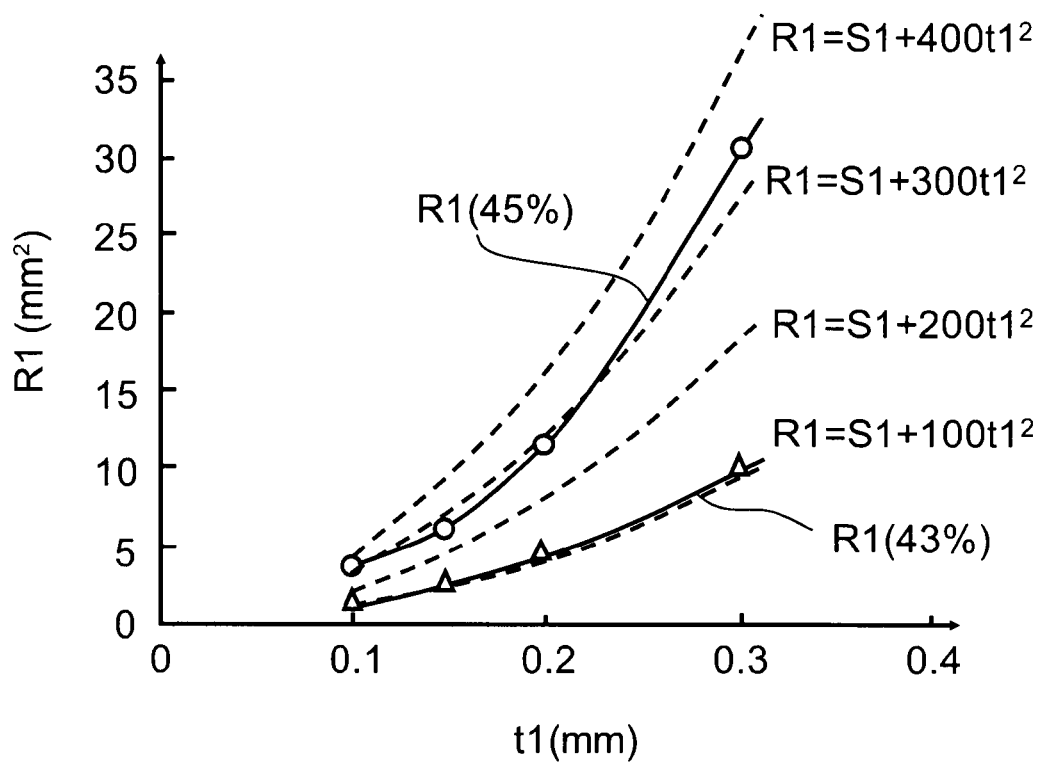
FIGS. 4A and 4B are graphs illustrating simulation results of the characteristics of a light emitting device.
Figure 4B:
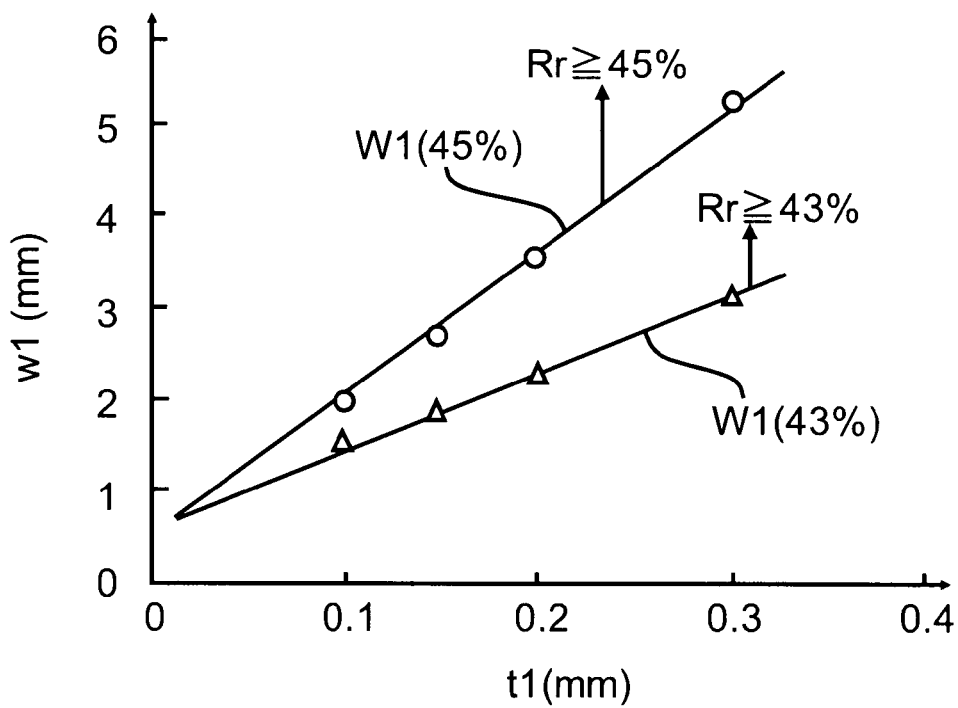

FIGS. 4A and 4B are graphs illustrating simulation results of the characteristics of the light emitting device.

FIG. 4A shows a relationship between the height t1 and an area R1 (43%) of the first reflection area 25a at which the reflection region incidence rate Rr is 43% or more, and a relationship between the height t1 and an area R1 (45%) of the first reflection area 25a at which the reflection region incidence rate Rr is 45% or more. FIG. 4A is derived from the results illustrated in FIG. 3A. In addition, in FIG. 4A, the area R1 of the first reflection region 25a when the reflection region incidence rate Rr reaches the desired value is hypothesized as $(S1+\alpha \times t1^2)$ and characteristics when the coefficient $\alpha$ is changed to 100, 200, 300, and 400 are illustrated by a broken line.

As illustrated in FIG. 4A, a relationship between the height t1 and the area R1 (45%) of the first reflection region 25a at which the reflection region incidence rate Rr becomes at least 45% can be seen to be given when the coefficient $\alpha$ is approximately 300—in other words, when the relationship is $R1 \geq S1+300 \times t1^2$.

In addition, a relationship between the height t1 and the area R1 (43%) of the first reflection region 25a at which the reflection region incidence rate Rr becomes at least 43% can be seen to be given when the coefficient $\alpha$ is approximately 100—in other words, when the relationship is $R1 \geq S1+100 \times t1^2$.

On the other hand, as illustrated in FIG. 3A, when the reflection region width w1 reaches a certain size, a rate of change of the reflection region incidence rate Rr with respect to the reflection region width w1 decreases. In this region, a contribution made to improve the light extraction efficiency by increasing the reflection region width w1 remains small.

By setting the area R1 to no more than $(S1+10000t1^2)$, it is possible to suppress the first reflection region 25a from becoming excessively large. Furthermore, in the case that it is possible in practice to obtain sufficiently high light extraction efficiency, the area R1 may be set to (S1+1000t1$^2$) or less. Accordingly, the first reflection region 25a can be set to what is in practice a small value and still be of a size at which high light extraction efficiency is obtained. This is more preferable since the light emitting device 110 that can be easily miniaturized, enabling greater freedom in a design of the light emitting device 110.

Similarly, with regard to the area R2 of the second reflection region 25b, when the above-described Equation 2 is satisfied, a high light extraction efficiency can be obtained in practical designs.

When, as illustrated in FIG. 3B, the semiconductor light emitting element width w2 is set to 0.35 mm, 0.6 mm, and 1 mm, and the height t1 is changed to 0.2 mm and 0.3 mm, the reflection region incidence rate Rr reaches 45% or more when an approximate relationship R1≥S1+300×t1$^2$ is satisfied. The reflection region incidence rate Rr reaches 43% or more when an approximate relationship of R1≥S1+100×t1$^2$ is satisfied Similarly, with regard to the area R2 of the second reflection region 25b, when the above-described Equation 2 is satisfied, a high light extraction efficiency can be obtained in practical designs.

FIG. 4B shows a relationship between the height t1 and the reflection region width w1 (43%), at which the reflection region incidence rate Rr is at least 43%, and a relationship between the height t1 and the reflection region width w1 (45%), at which the reflection region incidence rate Rr is at least 45%. FIG. 4B was derived from the results of the example illustrated in FIG. 3A.

As illustrated in FIG. 4B, the reflection region width w1 (43%), at which the reflection region incidence rate Rr is at least 43%, has a linear relationship with respect to the height t1. Similarly, the reflection region width w1 (45%), at which the reflection region incidence rate Rr is at least 45% has a linear relationship with respect to the height t1.

Here, the reflection region incidence width w1 at which the reflection region incidence rate Rr is at least 43% is hypothesized to have a relationship w1=w2+2×k43×t1 (where k43 is a coefficient). In other words, it is assumed that reflection region width w1=w2+w3+w4 and w3=w4=k43×t1.

From FIG. 4B, it is seen that the coefficient k43 is approximately 4. In other words, when the width w3 and the width w4 are at least 4 times the height t1, the reflection region incidence rate Rr is at least 43%.

Here, the reflection region incidence width w1 at which the reflection region incidence rate Rr is at least 45% is hypothesized to have a relationship w1=w2+2×k45×t1 (where k45 is a coefficient). In other words, it is assumed that reflection region width w1=w2+w3+w4 and w3=w4=k45×t1.

From FIG. 4B, is seen that the coefficient k45 is approximately 7. In other words, when the width w3 and the width w4 are at least 7 times the height t1, the reflection region incidence rate Rr is at least 45%.

Thus, it is preferable that the first reflection region 25a has an area (first protruding region 26a) that lies along a direction parallel to the major surface 11 and that protrudes from the first semiconductor light emitting element 30a, and that the first protruding region 26a includes a portion (portion of width w3 and width w4) for which a width along a protruding direction is at least 4 times the height t1. It is further preferable that the first protruding region 26a has a portion (portion of width w3 and width w4) for which a width along the protruding direction is at least 7 times the height t1.

Similarly, the second reflection region 25b has a second protruding region 26b that lies along the direction parallel to the major surface 11 and protrudes from the second semiconductor light emitting element 30b. It is preferable that the second protruding region 26b has a portion for which the width along the protruding direction is at least 4 times the height t2. With this arrangement, the reflection region incidence rate Rr can be set to at least 43%. It is more preferable that region that the second protruding region 26b has a portion for which the width along the protruding direction is at least 7 times the height t2. With this arrangement, the reflection region incidence rate Rr can be set to at least 45%.

As described above, provided that at least one of the width w3 and the width w4 is at least 4 times the height t1, a high light extraction efficiency (reflection region incidence rate of 43% or more) in a practical range is obtained. For example, if the semiconductor light emitting element 30 is not disposed centrally in the reflection region of the substrate 20 and the width w3 and the width w4 are different, it is sufficient for one of the width w3 and the width w4 to be at least 4 times the height t1.

In addition, when, for example, the widths w3 and w4 are different from each other, it is preferable that at least one of the width w3 and the width w4 is at least 7 times the height t1.

A preferable value for the width of the above-described first protruding region 26a, can also be established when, as illustrated in FIG. 3B, the semiconductor light emitting element width w2 is changed to 0.35 mm, 0.6 mm, and 1 mm, and the height t1 is changed to 0.2 mm and 0.3 mm.

Thus, the light emitting device 110 according to the embodiment includes the base substrate 10; the first substrate 20a provided on a major surface 11 of the base substrate 10 and including the first reflection region 25a that has a light reflectance higher than the light reflectance of the major surface 11 of the base substrate 20; the second substrate 20b juxtaposed with first substrate 20a on the major surface 11 of the base substrate 10 and including a second reflection region 25b having a light reflectance higher than the light reflectance of the major surface 11 of the base substrate 20; the first semiconductor light emitting element 30a provided on the first reflection region 25a on the first substrate 20a on a side opposite to the base substrate 10 and including the first stacked structural body 37a that includes the first light emitting layer 33a; and the second semiconductor light emitting element 30b provided on the second reflection region 25b on a side of the second substrate 20b that is opposite the base substrate 10 and including the second stacked structural body 37b that includes the second light emitting layer 33b.

The first semiconductor light emitting element 30a and the second semiconductor light emitting element 30b are each capable of receiving input power of 1 Watt. The gap between the first light emitting layer 33a and the first substrate 20a is t1 (mm) and the gap between the second light emitting layer 33b and the second substrate 20b is t2 (mm).

The first reflection region 25a has the first protruding region 26a protruding from the first semiconductor element 30a along the direction parallel to major surface 11, and the first protruding region 26a has a portion of a width along the protruding direction that is at least 4 times the height t1.

The second reflection region 25b has the second protruding region 26b protruding from the second semiconductor light emitting element 30b along the direction parallel to the major surface 11, and the second protruding region 26b has a portion of a width along the protruding direction that is at least 4 times the height t2.

The gap L (mm) between the first semiconductor light emitting element 30a and the second semiconductor light emitting element 30b satisfies the relationships 100t1≤L≤10000t1 and 100t2≤L≤10000t2.

Thereby, it is possible to minimize the area of the reflection regions whilst obtaining a high light extraction efficiency by causing a desired proportion (43%, for example) of the luminescent light emitted from the semiconductor light emitting element 30 to enter the reflection regions of the substrate 20.

It is more preferable that the first protruding region 26a of the first reflection region 25a has a portion for which the width along the protruding direction is at least 7 times the height t1. It also more preferable that the second protruding region 26b of the second reflection region 25b has a portion for which the width along the protruding direction is at least 7 times the height t2. With this arrangement, it is possible to minimize the area of the reflection regions whilst obtaining a high light extraction efficiency by causing a desired proportion (45%, for example) of the luminescent light to enter the reflection regions of the substrate 20.

According to this configuration, it is possible to provide a practical light emitting device including a plurality of high-power semiconductor light emitting elements and having a high light extraction efficiency.

According to the light emitting device 110 according to the embodiment, it is possible, within the limited space of the light emitting device 110, to easily reduce light-loss through absorption at the major surface 11 of the base substrate 10 of the luminescent light emitted from the semiconductor light emitting elements 30, without using a complicated structure.

Figure 5A:
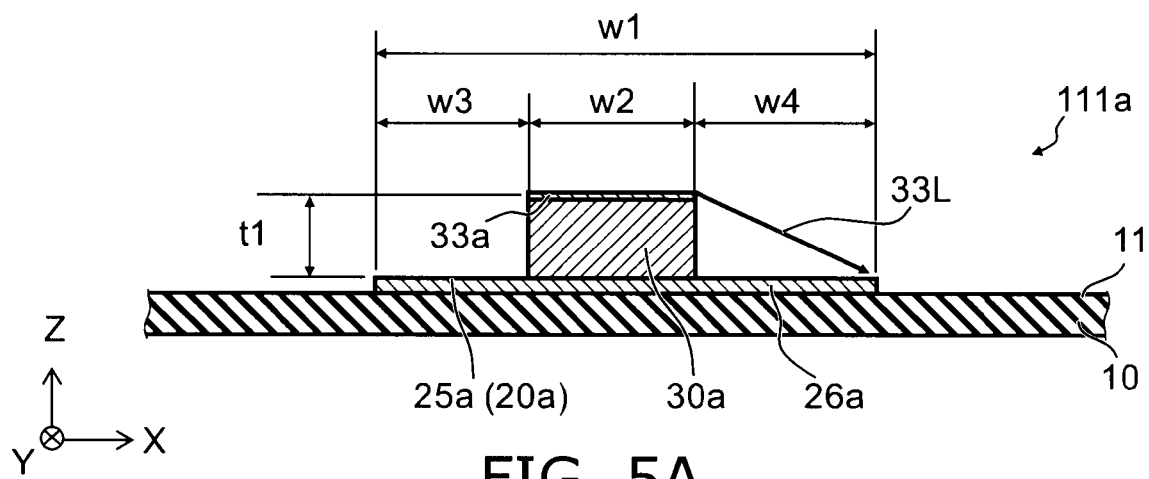
FIGS. 5A to 5C are schematic cross-sectional views illustrating light emitting devices according to the first embodiment.
Figure 5B:
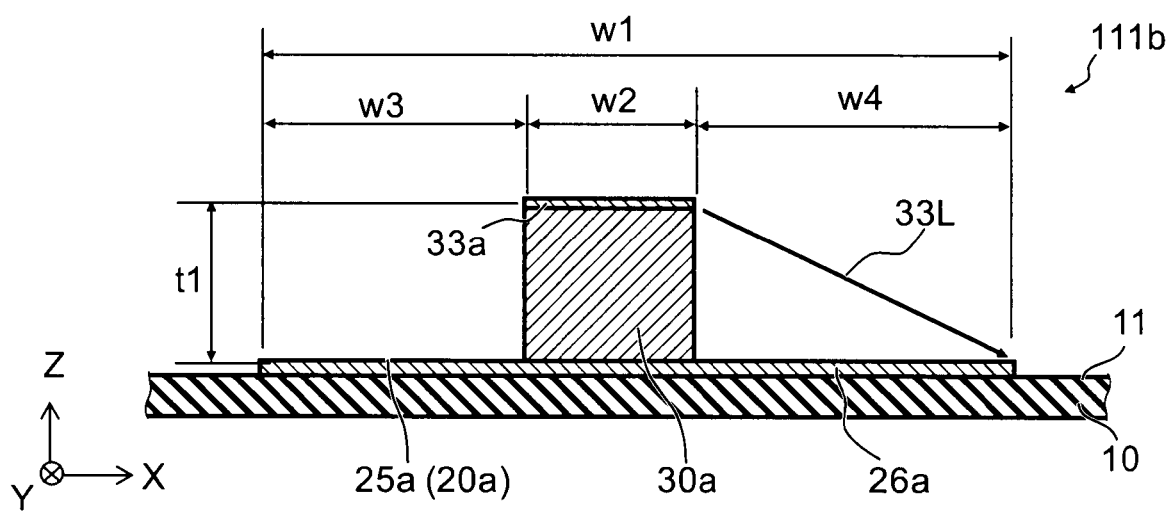
Figure 5C:
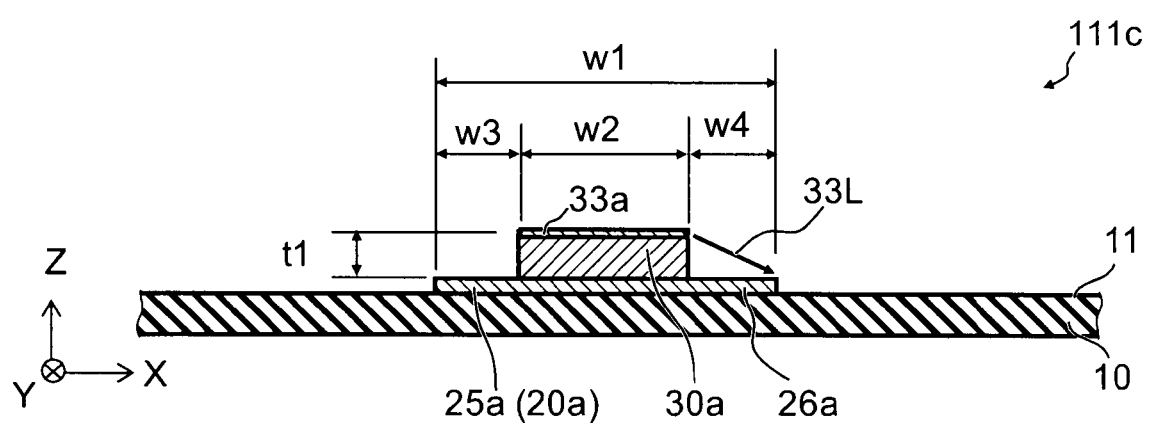

FIGS. 5A to 5C are schematic cross-sectional views illustrating the configuration of light emitting devices according to the first embodiment.

FIGS. 5A, 5B and 5C respectively illustrate the configuration of light emitting devices 111a, 111b and 111c according to the embodiment. In these light emitting devices, the semiconductor light emitting element width w2 is constant while the heights t1 are different. In the drawings, the first base body 22a has been omitted, and the first reflection region 25a (for example, the first highly-reflective layer 21a) is illustrated.

As illustrated in FIGS. 5A and 5B, the height t1 in the light emitting device 111b is greater than the height t1 in the light emitting device 111a. The first reflection region width w1 of the light emitting device 111b is set to be wider than the first reflection region width w1 of the light emitting device 111a. In other words, the width w3 and the width w4 in the light emitting device 111b are set to be greater than the width w3 and the width w4 in the light emitting device 111a. Accordingly, a desired proportion (for example, 43% or 45%) of a luminescent light 33L from the light emitting device 111b can be caused to enter the first reflection region 25a. Specifically, in the light emitting device 111b with a large height t1, the same high light extraction efficiency as for the light emitting device 111a is obtained.

As illustrated in FIGS. 5A and 5C, the height t1 in the light emitting device 111c is smaller than the height t1 in the light emitting device 111a. The first reflection region width w1 in the light emitting device 111c is set to be narrower than the first reflection region w1 in the light emitting device 111a. In other words, the width w3 and the w4 in the light emitting device 111c are set to be narrower than the width w3 and the w4 in the light emitting device 111a. Thereby, in the light emitting device 111c in which the height t1 is small, it is possible to minimize the size of the first reflection region 25a while causing the desired proportion (for example, 43% or 45%) of the luminescent light 33L to enter the first reflection region 25a. As a result, for example, the size of the light emitting device 111c can be miniaturized, and the materials for the first reflection region 25a can be reduced.

The width of the protruding region of the first reflection region 25a (corresponding to the width w3 and the width 4 of the first protruding region 26a) is not related to the height t1 in the first semiconductor light emitting element 30a. In the case, for instance, when the width of the protruding region is set based on the semiconductor light emitting element width w2 and the height t1 is great, a portion of the luminescent light 33L enters out of the range of the first reflection region 25a and the light extraction efficiency falls. On the other hand, when the height t1 is small, the area of the first reflection region will be greater than required and losses will be generated.

In contrast, in the embodiment, the area of the first reflection region 25a can be minimized while obtaining a high light extraction efficiency by causing a desired proportion of the luminescent light 33L (for example, 43% or 45%) to enter the first reflection region.

In the embodiment, the height t1 is at least 50 micrometers (μm) and preferably 500 μm. In this embodiment, the area of the first reflection region 25a (and the width w3 and width w4 of the protruding portions etc.) are set according to the height t1. By setting the height t1 to be 500 μm or less, an area S1 of the first reflection region 25a can be suppressed from becoming excessive. In addition, by setting the height t1 to at least 50 μm, the mechanical strength of the first semiconductor light emitting element 30a can be made great and mounting is easier to implement. Similarly, the height t2 is at least 50 μm and preferably 500 μm.

In addition, a dominant wavelength of the light emitted from the first semiconductor light emitting element 30a is preferably 550 nanometers (nm) or shorter. Materials for which a reflectance with respect to light at short wavelengths of 550 nm or less is high include silver and aluminum. However, there are many constraints on the materials that can be used in practice. Hence, in the light emitting device on which the semiconductor light emitting element that emits the light at 550 nm or less, a configuration in which a high light extraction efficiency is realized with a minimum area for the reflection region is vital. Specifically, the configuration of the embodiment is made particularly effective through use in a light emitting device for which the dominant wavelength of light emitted from the first semiconductor light emitting element 30a is 550 nm or shorter. Similarly, the dominant wavelength of the light emitted from the second semiconductor light emitting element 30b is preferably 550 nm or shorter, and the configuration of this embodiment can be suitably employed in such a case.

It is preferable that the reflectance of the first reflection region 25a with respect to the dominant wavelength of the light from the first semiconductor light emitting element 30a is at least 80%. Thereby, a high light extraction efficiency can be obtained. Similarly, it is preferable that reflectance of the second reflection region 25b with respect to the dominant wavelength of the light emitted from the second semiconductor light emitting element 30b is at least 80%.

The surfaces of the first reflection region 25a and the second reflection region 25b are preferably, for example, a silver layer. By using silver, a reflectance of approximately 95% can, for example, be obtained. In addition, if a reflection enhancement film is added, a reflectance of approximately 98% can be obtained. On the other hand, since silver is expensive and deteriorates easily in the atmosphere, it is difficult in practice to use large quantities of silver in the base substrate 10 of the light emitting device 110. However, by using a silver layer as the first reflection region 25a and the second reflection region 25b and using the configuration of the embodiment, a high light extraction efficiency can be realized with a minimum area for the reflection region.

By using, for example, the silver layer in the first reflection region 25a and the second reflection region 25b and appropriately controlling the areas of the first reflection region 25a and the second reflection region 25b, constraints on the reflectance of, for example, the base substrate 10 in areas outside the reflection region are removed. Accordingly, a general-purpose printed substrate can, for example, be used as the base substrate 10. The constraints on the light absorption properties of the electrical members of the copper wiring, capacitors and the like, which are provided on the main surface 11 of the base substrate 10 are removed. Accordingly, a highly useful light emitting device can be provided.

It is preferable that a single one of the semiconductor light emitting elements 30 is mounted on each of the substrates 20. Accordingly, the heat dissipation of each of the semiconductor light emitting elements 30 is improved and the high luminous efficiency can be maintained. In other words, it is preferable that the light emitting device 110 does not have a semiconductor light emitting element other than the first semiconductor light emitting element 30a on the first reflection region 25a, nor a semiconductor light emitting element other than the second semiconductor light emitting element 30b on the second reflection region 25b.

Figure 6A:
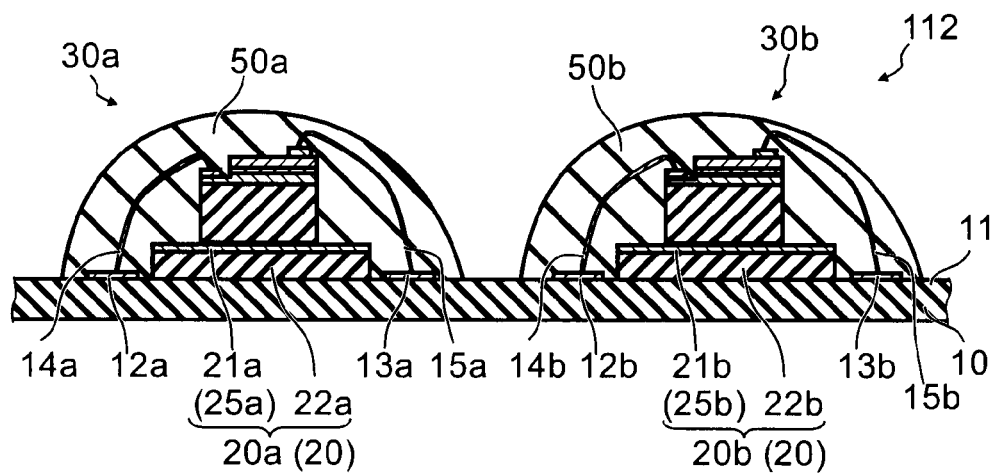
FIGS. 6A to 6C are schematic cross-sectional views illustrating other light emitting devices according to the first embodiment.
Figure 6B:
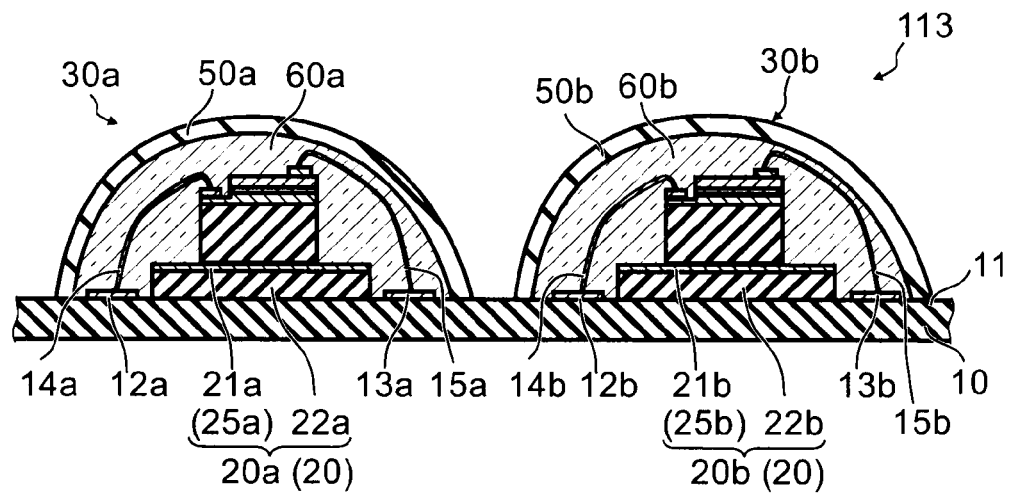
Figure 6C:
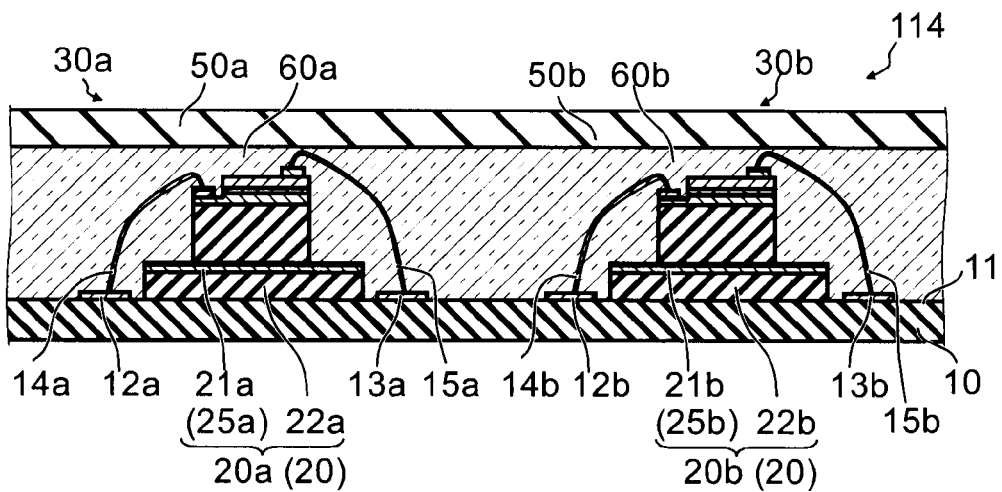

FIGS. 6A to 6C are schematic cross-sectional views illustrating configurations of other light emitting devices according to the first embodiment.

As illustrated in FIG. 6A, another light emitting device 112 according to this embodiment further includes a first wavelength conversion layer 50a. The first wavelength conversion layer 50a has a portion of the first substrate 20a that is opposite the first semiconductor light emitting element 30a, absorbs first light emitted from the first semiconductor light emitting element 30a, and emits light of a wavelength that differs from the wavelength of the first light. The light emitting device 112 further includes a second wavelength conversion layer 50b. The second wavelength conversion layer 50b has a portion of the second substrate 20b that is opposite the second semiconductor light emitting element 30b, absorbs second light emitted from the second semiconductor light emitting element 30b, and emits light of a wavelength that differs from the wavelength of the second light.

In the example, the first wavelength conversion layer 50a covers the first semiconductor light emitting element 30a and the first substrate 20a, and the second wavelength conversion layer 50b covers the second semiconductor light emitting element 30b and the second substrate 20b.

For the first wavelength conversion layer 50a and the second wavelength conversion layer 50b, for example, a phosphor layer may be used. The first wavelength conversion layer 50a and the second wavelength conversion layer 50b absorb at least one of ultraviolet, violet, and blue light emitted from the first semiconductor light emitting element 30a and the second semiconductor light emitting element 30b, and emit, for example, one of green, yellow, and red light. Accordingly, light of a desired tonality, such as white light can be obtained from the light emitting device 112.

At least one of the first wavelength conversion layer 50a and the second wavelength conversion layer 50b can have a plurality of stacked layers, and the wavelength of the emitted light can be caused to differ using the plurality of layers. With this arrangement efficient wavelength conversion is possible, and efficiency can be improved.

As illustrated in FIG. 6B, the light emitting device 113 according to the embodiment further includes a first transparent layer 60a. The first transparent layer 60a is provided between the first wavelength conversion layer 50a and the first semiconductor light emitting element 30a, and is transparent with respect to the first light emitted from the first semiconductor light emitting element 30a. The light emitting device 113 further includes a second transparent layer 60b. The second transparent layer 60b is provided between the second wavelength conversion layer 50b and the second semiconductor light emitting element 30b, and is transparent with respect to the second light emitted from the second semiconductor light emitting element 30b.

By providing the first transparent layer 60a and the second transparent layer 60b, transmission of the heat generated in wavelength conversion in the first wavelength conversion layer 50a and the second wavelength conversion layer 50b to the first semiconductor light emitting element 30a and the second semiconductor light emitting element 30b can be inhibited more. For the first transparent layer 60a and the second transparent layer 60b, besides a transparent resin such as silicone resin, a gas layer of air or the like can be used.

As illustrated in FIG. 6C, in the light emitting device 114 according to the embodiment, the first wavelength conversion layer 50a and the second wavelength conversion layer 50b are contiguous with each other. In addition, the first transparent layer 60a and the second transparent layer 60b are contiguous with each other. Thus, at least one of the wavelength conversion layer and transparent layer can be provided in a contiguous manner on a plurality of semiconductor light emitting devices.

Second Embodiment

Figure 7:
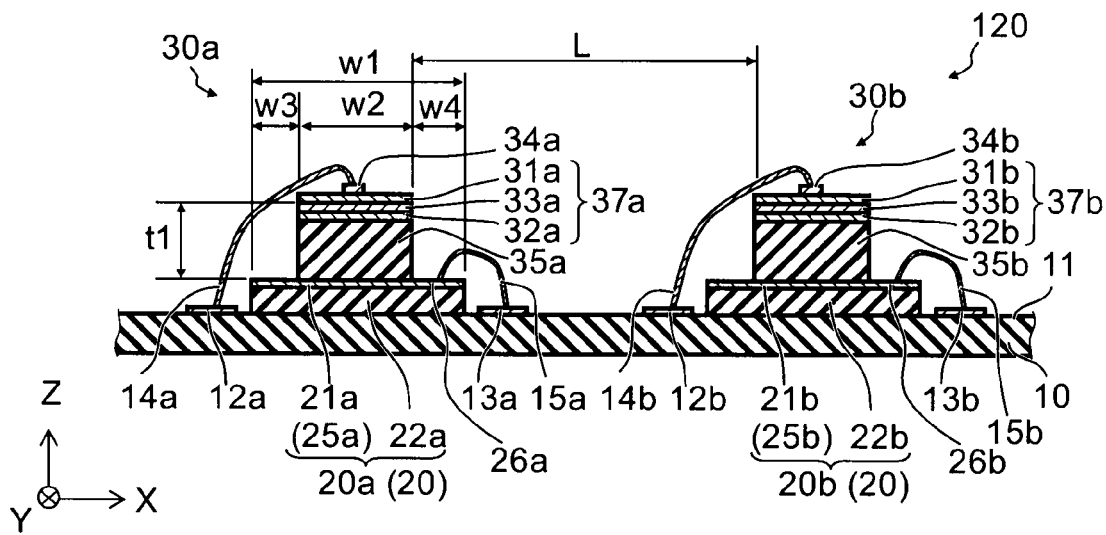
FIG. 7 is a schematic cross-sectional view illustrating a light emitting device according to a second embodiment.

FIG. 7 is a schematic cross-sectional view illustrating a configuration of a light emitting device according to a second embodiment.

As illustrated in FIG. 7, a light emitting device 120 according to the embodiment differs from the case of the light emitting device 110 in the configuration of the first semiconductor light emitting element 30a and the second semiconductor light emitting element 30b.

In the light emitting device 120, the first substrate 20a includes the first base body 22a, and the first highly-reflective layer 21a that is provided on the first semiconductor light emitting element 30a side of the base body 22a, which has a light reflectance higher than the light reflectance of the major surface 11 of the base substrate 10, and which forms the first reflection region 25a. The second substrate 20b includes the second base body 22b, and the second highly-reflective layer 21b that is provided on the first semiconductor light emitting element 30b side of the base body 22b, which has a light reflectance higher than the light reflectance of the major surface 11 of the base substrate 10, and which forms the second reflection region 25b.

The first stacked structural body 37a further includes the first n-type semiconductor layer 31a provided on the first light emitting layer 33a on a side opposite to the first substrate 20a and the first p-type semiconductor layer 32a provided between the first light emitting layer 33a and the first substrate 20a. The first semiconductor light emitting element 30a further includes the first p-side element electrode 35a that contacts the first p-type semiconductor layer 32a between the first p-type semiconductor layer 32a and the first substrate 20a, and the first n-side element electrode 34a that contacts the first n-type semiconductor layer 31a on a side opposite to the first substrate 20a. Thus, in the present embodiment, the first p-side element electrode 35a is provided at one end of a stacking direction of the first semiconductor light emitting element 30a, and the first n-side element electrode 34a is provided at the other end.

The first p-side element electrode 35a is then electrically connected to the first highly-reflective layer 21a. In other words, the first highly-reflective layer 21a functions as an electrode. The first highly-reflective layer 21a and the first p-side base electrode 13a are then electrically connected by the first p-side wire 15a.

Similarly, the second stacked structural body 37b further includes the second n-type semiconductor layer 31b provided on the first second light emitting layer 33b on a side opposite to the second substrate 20b, and the second p-type semiconductor layer 32b that is provided between the second light emitting layer 33b and the second substrate 20b. The second semiconductor light emitting element 30b further includes the second p-side element electrode 35b that contacts the second p-type semiconductor layer 32b between the second p-type semiconductor layer 32b and the second substrate 20b, and the second n-side element electrode 34b that contacts the second n-type semiconductor layer 31b on a side opposite to the second substrate 20b. The second p-side element electrode 35b is electrically connected to the second highly-reflective layer 21b. The second highly-reflective layer 21b and the second p-side base electrode 13b are electrically connected by the second p-side wire 15b.

In the light emitting device 120 in such a configuration, the first semiconductor light emitting element 30a and the second semiconductor light emitting element 30b are each capable of receiving input power of at least 1 Watt.

In the light emitting device 120, the first reflection region 25a and second reflection region 25b are based on the height t1 and the height t2 in the same way as the light emitting device 110. In other words, the Equations 1 and 2 are satisfied For example, the first reflection region 25a has the first protruding region 26a that protrudes from the first semiconductor light emitting element 30a along a direction parallel with respect to the major surface 11 of the first reflection region 25a, and it is preferable that the first protruding region 26a has a portion for which the width along the protruding direction is 4 times the height t1. It is more preferable that the first protruding region 26a has a portion for which the width along the protruding direction is at least 7 times the height t1. The same applies for the second reflection region 25b. The gap L between the first semiconductor light emitting element 30a and the second semiconductor light emitting element 30b satisfies the above-described relationships of Equation 3 and Equation 4.

According to the light emitting device 120, it is also possible to provide a practical light emitting device including a plurality of high-power semiconductor light emitting elements and a having a high light extraction efficiency.

In the light emitting device 120, the first p-side element electrode 35a that is connected to the first p-type semiconductor layer 32a is in contact with the first highly-reflective layer 21a, and consequently, the heat generated in the first p-side element electrode 35a is transmitted toward the first substrate 20a and the base substrate 10, thereby enabling an improvement in the heat dissipation. Similarly, the heat generated in the second semiconductor light emitting element 30b is transmitted toward the second substrate 20b and the base substrate 10 via the second highly-reflective layer 21b, enabling an improvement in the heat dissipation. Consequently, efficiency can be improved.

Third Embodiment

Figure 8:
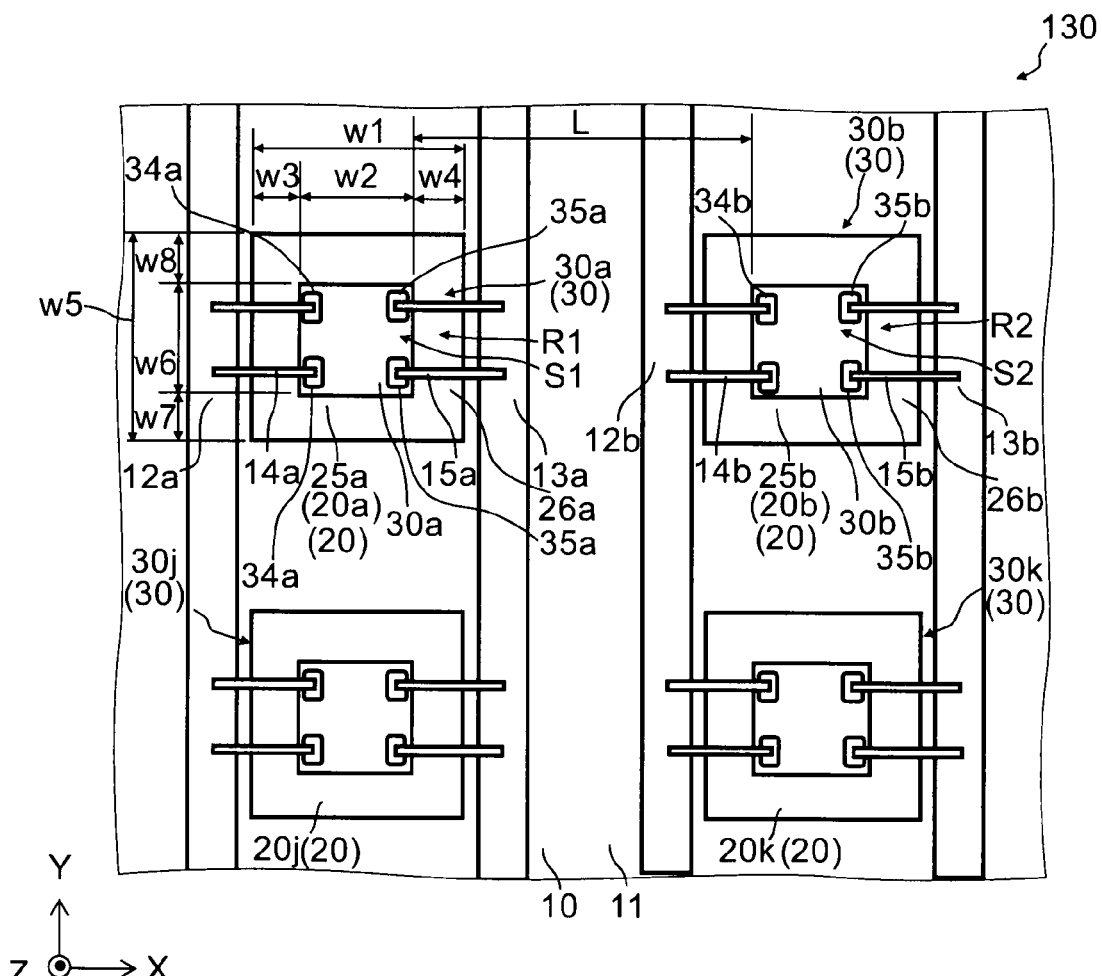
FIG. 8 is a schematic plan view illustrating a light emitting device according to a third embodiment.

FIG. 8 is a schematic view illustrating a configuration of a light emitting device according to a third embodiment.

As illustrated in FIG. 8, in a light emitting device 130 according to the embodiment, the configuration of the first semiconductor light emitting element 30a and the second semiconductor light emitting element 30b differ from the case of the light emitting device 110. In the light emitting device 130, a plurality of element electrodes are provided.

The first stacked structural body 37a further includes a first p-type semiconductor layer 32a provided on the first light emitting layer 33a on a side opposite to the first substrate 20a, and a first n-type semiconductor layer 31a provided between the first light emitting layer 33a and the first substrate 20a. The first semiconductor light emitting element 30a further includes a plurality of first p-side element electrodes 35a in contact with the first p-type semiconductor layer 32a on a surface on the first p-type semiconductor layer 32a side of the first stacked structural body 37a, and a plurality of first n-side element electrodes 34a in contact with the first n-type semiconductor layer 31a on a surface on the first p-type semiconductor layer 32a side of the first stacked structural body 37a.

The second stacked structural body 37b further includes the second p-type semiconductor layer 32b that is provided on the second light emitting layer 33b on a side opposite to the second substrate 20b, and the second n-type semiconductor layer 31b provided between the second light emitting layer 33b and the second substrate 20b. The second semiconductor light emitting element 30b further includes a plurality of second p-side electrodes 35b in contact with the second p-type semiconductor layer 32b on the surface of the second p-type semiconductor layer 32b side of the second stacked structural body 37b, and a plurality of the second n-side element electrodes 34b in contact with the second n-type semiconductor layer 31b on the surface of the second p-type semiconductor layer 32b side of the second stacked structural body 37b.

In the light emitting device 130, the first semiconductor light emitting element 30a and the second semiconductor light emitting element 30b are each capable of receiving an input power of 1 Watt or more.

In the light emitting device 130, the first reflection region 25a and the second reflection region 25b are set based on the height t1 and the height t2. In other words, the Equation 1 and the Equation 2 are satisfied. It is preferable that, for example, the first reflection region 25a has a first protruding region 26a that protrudes from the first semiconductor element 30a along a direction that is parallel with respect to the major surface 11, and the first protruding region 26a has a portion that has a width along the protruding direction that is 4 times the height t1. It is more preferable that the first protruding region 26a has a portion that has a width along the protruding direction that is at least 7 times the height t1. The same applies for the second reflection region 25b. The gap L between the first semiconductor light emitting element 30a and the second semiconductor light emitting element 30b then satisfies the relationships of the above-described Equation 3 and Equation 4.

According to the light emitting device 120, it is also possible to provide a practical light emitting device including a plurality of high-power semiconductor light emitting elements and a having a high light extraction efficiency.

In the light emitting device 130, a plurality of pairs of element electrodes (plurality of first p-side element electrodes 35a, a plurality of first n-side element electrodes 34a, a plurality of second p-side element electrodes 35b and a plurality of second n-side element electrodes 34b are provided, and it is consequently possible to input particularly large electrical power to the first semiconductor light emitting element 30a and the second semiconductor light emitting element 30b.

According to the embodiment, it is possible to provide a practical light emitting device including a plurality of high-power semiconductor light emitting elements and having a high light extraction efficiency.

In the specification, the term, "nitride semiconductor" includes semiconductors of all compositions wherein composition ratios of x, y, and z of the formula $B_xIn_yAl_zGa_{1-x-y-z}N$ fall within the respective ranges of $0 \leq x \leq 1$, $0 \leq y \leq 1$, $0 \leq z \leq 1$, and $x+y+z \leq 1$. Furthermore, in the formula described above, "nitride semiconductors" shall also be understood to include semiconductors further including group V elements other than N (nitrogen), semiconductors further including various elements added to control various physical properties such as conductivity type and the like, and semiconductors further including various elements that are included unintentionally.

In this specification, "perpendicular" and "parallel" are not used to mean perpendicular and parallel in their strict sense, but rather substantially perpendicular or parallel so as to take factors into account such as variations in manufacturing processes and the like.

Embodiments of the invention with reference to examples were described above. However, the invention is not limited to these examples. With regard to the specific configurations of, for example, the base substrate, substrate, base bodies, highly-reflective layers, semiconductor light emitting elements, element electrodes, element substrates, electrodes, and the like included in the light emitting device, when a person skilled in the art implements a configuration in the same way as in the present invention by appropriately selecting from the prior art, that configuration shall be included in the scope of the present invention.

Additionally, combinations of constituents from two or more of the examples are also included in the scope of the invention, provided they are technically possible and do not depart from the spirit of the invention.

Moreover, all light emitting devices obtained by appropriate design modifications by a person skilled in the art based on the light emitting devices described as embodiments of the present invention also fall within the scope of the present invention provided that they do not depart from the spirit of the invention.

Furthermore, regarding the scope of the spirit of the invention, it is understood that a variety of variations and modifications could be conceived by a person skilled in the art and that these variations and modifications all fall within the scope of the invention as well.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A light emitting device comprising:
a base substrate having a major surface;
a first substrate provided on the major surface and including a first reflection region parallel to the major surface and having a light reflectance higher than a light reflectance of the major surface;
a second substrate juxtaposed with the first substrate on the major surface and including a second reflection region parallel to the major surface and having a light reflectance higher than the light reflectance of the major surface;
a first semiconductor light emitting element provided on the first reflection region, the first semiconductor light emitting element including a first stacked structural body including a first light emitting layer; and
a second semiconductor light emitting element provided on the second reflection region, the second semiconductor light emitting element including a second stacked structural body including a second light emitting layer,
an area of a face on a side of the first semiconductor light emitting element opposite to the first substrate being S1 (square millimeters), and a gap between the first light emitting layer and the first substrate being t1 (millimeters),
an area of a face on a side of the second semiconductor light emitting element opposite to the second substrate being S2 (square millimeters), and a gap between the second light emitting layer and the second substrate being t2 (millimeters),
an area R1 of the first reflection region (square millimeters) satisfying a relationship $(S1+100t1^2) \leq R1 \leq (S1+10000t1^2)$,
an area R2 of the second reflection region (square millimeters) satisfying a relationship $(S2+100t2^2) \leq R2 \leq (S2+10000t2^2)$, and
a gap L (millimeters) between the first semiconductor light emitting element and the second semiconductor light emitting element satisfying relationships $100t1 \leq L \leq 10000t1$ and $100t2 \leq L \leq 10000t2$,
the first reflection region including a first protruding region surrounding in a whole circumference of the first semiconductor light emitting element when projected in a plane perpendicular to a direction from the base substrate to the first substrate, the first protruding region having a first width between a rim of the first semiconductor light emitting element and a rim of the first reflection region not less than four times the t1 in the whole circumference, and
the second reflection region including a second protruding region surrounding in a whole circumference of the second semiconductor light emitting element when projected in a plane perpendicular to a direction from the base substrate to the second substrate, the second protruding region having a second width between a rim of the second semiconductor light emitting element and a rim of the second reflection region not less than four times the t2 in the whole circumference.

2. The device according to claim 1, wherein
the first substrate includes:
a first base body; and
a first highly-reflective layer provided on a first semiconductor light emitting element side of the first base body, having a light reflectance higher than the light reflectance of the major surface, and being served as the first reflection region, the second substrate includes:

a second base body; and a second highly-reflective layer provided on a second semiconductor light emitting element side of the second base body, having a light reflectance higher than the light reflectance of the major surface, and being served as the second reflection region.

3. The device according to claim 1, wherein the t1 and the t2 are not less than 50 micrometers and not more than 500 micrometers.

4. The device according to claim 1, wherein a dominant wavelength of light emitted from the first semiconductor light emitting element and a dominant wavelength of light emitted from the second semiconductor light emitting element is 550 nanometers or shorter.

5. The device according to claim 1, wherein a reflectance of the first reflection region with respect to a dominant wavelength of light emitted from the first semiconductor light emitting element and a reflectance of the second reflection region with respect to a dominant wavelength of light emitted from the second semiconductor light emitting element are not less than 80%.

6. The device according to claim 1, wherein a semiconductor light emitting element other than the first semiconductor light emitting element is not provided on the first reflection region, and a semiconductor light emitting element other than the second semiconductor light emitting element is not provided on the second reflection region.

7. The device according to claim 1, wherein the first stacked structural body further includes:

a first p-type semiconductor layer, the first light emitting layer being disposed between the first p-type semiconductor layer and the first substrate, and a first n-type semiconductor layer provided between the first light emitting layer and the first substrate, the first semiconductor light emitting element further includes a first element substrate which is provided between the first n-type semiconductor layer and the first substrate, the first element substrate being transparent with respect to light emitted from the first light emitting layer, the second stacked structural body further includes:

a second p-type semiconductor layer, the second light emitting layer being disposed between the second p-type semiconductor layer and the second substrate; and a second n-type semiconductor layer which is provided between the second light emitting layer and the second substrate, the second semiconductor light emitting element further includes a second element substrate which is provided between the second n-type semiconductor layer and the second substrate, the second element substrate being transparent with respect to light emitted from the second light emitting layer.

8. The device according to claim 1, wherein the first stacked structural body further including:

a first p-type semiconductor layer, the first light emitting layer being disposed between the first p-type semiconductor layer and the first substrate; and a first n-type semiconductor layer which is provided between the first light emitting layer and the first substrate, the first light emitting element further includes:

a plurality of first p-side element electrodes contacting the first p-type semiconductor layer on a surface on a first p-type semiconductor layer side of the first stacked structural body; and a plurality of first n-side element electrodes contacting the first n-type semiconductor layer on a surface on the first p-type semiconductor layer side of the first stacked structural body.

9. The device according to claim 1 further comprising:

a first p-side base electrode and a first n-side base electrode provided on the major surface, the first stacked structural body further including:

a first p-type semiconductor layer, the first light emitting layer being disposed between the first p-type semiconductor layer and the first substrate; and a first n-type semiconductor layer provided between the first light emitting layer and the first substrate, the first semiconductor light emitting element further including:

a first p-side element electrode contacting the first p-type semiconductor layer on a surface of a first p-type semiconductor layer side of the first stacked structural body; and a first n-type element electrode contacting the first n-type semiconductor layer on a surface on the first p-type semiconductor layer side of the first stacked structural body, the first p-side base electrode being electrically connected to the first p-side element electrode, and the first n-side base electrode being electrically connected to the first n-side element electrode.

10. The device according to claim 1, wherein the first substrate includes a first base body, and a first highly-reflective layer provided on a first semiconductor light emitting element side of the first base body, the first highly-reflective layer has a light reflectance higher than the light reflectance of the major surface of the base substrate and is served as the first reflection region, the first stacked structural body further includes:

a first n-type semiconductor layer, the first light emitting layer being disposed between the first n-type semiconductor layer and the first substrate; and a first p-type semiconductor layer provided between the first light emitting layer and the first substrate, the first semiconductor light emitting element further includes:

a first p-side element electrode contacting the first p-type semiconductor layer between the first p-type semiconductor layer and the first substrate; and a first n-side element electrode contacting the first n-type semiconductor layer on a side of the first n-type semiconductor layer opposite the first substrate, the first p-side element electrode is electrically connected to the first highly-reflective layer.

11. The device according to claim 1, wherein the first width is not less than seven times the t1 in the whole circumference, and the second width is not less than seven times the t2 in the whole circumference.

12. The device according to claim 1, wherein each of the first and the second semiconductor light emitting elements are configured to be inputted with a power not less than 1 Watt.

* * * * *